US00RE42037E

(19) United States
(12) Reissued Patent
Isham

(10) Patent Number: US RE42,037 E
(45) Date of Reissued Patent: Jan. 18, 2011

(54) PROGRAMMABLE CURRENT-SENSING CIRCUIT PROVIDING CONTINUOUS TEMPERATURE COMPENSATION FOR DC-DC CONVERTER

(75) Inventor: Robert Haynes Isham, Flemington, NJ (US)

(73) Assignee: Intersil Americas Inc., Milpitas, CA (US)

(21) Appl. No.: 12/426,884

(22) Filed: Apr. 20, 2009

Related U.S. Patent Documents

Reissue of:
(64) Patent No.: 6,765,372
Issued: Jul. 20, 2004
Appl. No.: 10/304,245
Filed: Nov. 26, 2002

U.S. Applications:

(63) Continuation of application No. 11/488,927, filed on Jul. 18, 2006, now Pat. No. Re. 40,915.
(60) Provisional application No. 60/340,324, filed on Dec. 14, 2001.

(51) Int. Cl.
*G05F 1/10* (2006.01)
*G05F 1/455* (2006.01)
*G05F 1/613* (2006.01)

(52) U.S. Cl. ..... 323/224; 323/284; 323/288; 323/907

(58) Field of Classification Search ..... 323/224, 323/284, 282, 288, 907
See application file for complete search history.

(56) References Cited

U.S. PATENT DOCUMENTS

| | | | |
|---|---|---|---|
| 4,325,017 | A | 4/1982 | Schade, Jr. |
| 5,134,355 | A | 7/1992 | Hastings |
| 5,481,178 | A | 1/1996 | Wilcox et al. |
| 5,552,695 | A | 9/1996 | Schwartz |
| 5,568,044 | A | 10/1996 | Bittner |
| 5,705,919 | A | 1/1998 | Wilcox |
| 5,767,664 | A | 6/1998 | Price |
| 5,912,552 | A | 6/1999 | Tateishi |
| 6,246,220 | B1 | 6/2001 | Isham et al. |
| 6,300,818 | B1 | 10/2001 | Mao |
| 6,528,976 | B1 | 3/2003 | Lenk et al. |

FOREIGN PATENT DOCUMENTS

| | | |
|---|---|---|
| EP | 0778509 | 6/1997 |
| EP | 0992799 | 4/2000 |
| JP | 3043809 | 2/1991 |
| JP | 6174489 | 6/1994 |
| JP | 11194842 | 7/1999 |
| JP | 2000116119 | 4/2000 |

*Primary Examiner*—Bao Q Vu
(74) *Attorney, Agent, or Firm*—Fogg & Powers LLC

(57) ABSTRACT

A current-sensing and correction circuit having programmable temperature compensation circuitry that is incorporated into a pulse width modulation controller of a buck mode DC—DC converter. The front end of the controller contains a sense amplifier, having an input coupled via a current feedback resistor to a common output node of the converter. The impedance of a MOSFET, the current through which is sampled by a sample and hold circuit is controlled by the sense amplifier unit. A sensed current correction circuit is coupled between the sample and hold circuit and the controller, and is operative to supply to the controller a correction current having a deterministic temperature-compensating relationship to the sensed current. The ratio of correction current to sensed current equals a value of one at a predetermined temperature, and has other values at temperatures other than at that temperature.

8 Claims, 4 Drawing Sheets

PROGRAMMABLE CURRENT-SENSING CIRCUIT PROVIDING CONTINUOUS TEMPERATURE COMPENSATION FOR DC-DC CONVERTER

Matter enclosed in heavy brackets [ ] appears in the original patent but forms no part of this reissue specification; matter printed in italics indicates the additions made by reissue.

CROSS-REFERENCE TO RELATED APPLICATION

[The present application claims the benefit of co-pending U.S. Provisional Patent Application, Serial No. 60/340,324, filed Dec. 14, 2001, entitled: "Continuous Control Temperature Compensated Current Sensing Technique for DC to DC," by R. Isham, assigned to the assignee of the present application and the disclosure of which is incorporated herein.]

*Notice: More than one reissue application has been filed for the reissue of U.S. Pat. No. 6,765,372. The reissue applications are reissue application Ser. No. 11/488,927 (the parent reissue); and reissue application Ser. No. (12/426,884) (the present, continuation reissue application). Both Reissue applications are reissues of the same U.S. Pat. No. 6,765,372.*

*This reissue application claims the benefit of U.S. Provisional Patent Application Ser. No. 60/340,324, filed Dec. 14, 2001.*

FIELD OF THE INVENTION

The present invention relates in general to electronic circuits and components therefor, and is particularly directed to a new and improved current-sensing and correction circuit with programmable, continuous compensation for temperature variations of an output switching MOSFET of a buck mode DC—DC converter.

BACKGROUND OF THE INVENTION

Electrical power for an integrated circuit (IC) is typically supplied by one or more direct current (DC) power sources, such as a buck-mode, pulse width modulation (PWM) based, DC—DC converter of the type diagrammatically shown in FIG. 1. As shown therein, a controller 10 supplies a PWM signal to a (MOSFET gate) driver 20, for controlling the turn-on and turn-off of a pair of electronic power switching devices, to which a load is coupled. In the illustrated DC—DC converter, these power switching devices are depicted as an upper (or high side) power NMOSFET (or NFET) device 30, and a lower (or low side) power NFET device 40, having their drain-source current flow paths connected in series between a pair of power supply rails (e.g., VIN and ground (GND)).

The upper NFET device 30 is turned on and off by an upper gate switching signal UGATE being applied to its gate from driver 20, and the lower NFET device 40 is turned on and off by a lower gate switching signal LGATE from driver 20. A common node 35 between the upper and lower NFETs is coupled through an inductor 50 (which may typically comprise a transformer winding) to a load reservoir capacitor 60 coupled to a reference voltage terminal (GND). A connection 55 between inductor 50 and capacitor 60 serves as an output node from which a desired (regulated) DC output voltage Vout is applied to a LOAD 65 (shown as coupled to GND).

The output node connection 55 is also fed back to error amplifier circuitry (not shown) within the controller, the error amplifier being used to regulate the converter's output DC voltage relative to a reference voltage supply. In addition, the common node 35 is also coupled to current-sensing circuitry 15 within controller 10, in response to which the controller adjusts the PWM signal, as necessary, to maintain the converter's DC output within a prescribed set of parameters.

For this purpose, the controller may incorporate a current-sensing circuit of the type described in U.S. Pat. No. 6,246,220, entitled: "Synchronous-Rectified DC to DC Converter with Improved Current Sensing," issued Jun. 12, 2001, by R. Isham et al, assigned to the assignee of the present application and the disclosure of which is incorporated herein. As described therein, the controller monitors the source-drain current flowing through the lower NFET 40 by way of a current-sensing or scaling resistor 37 electrically interconnected between node 35 and an current-sensing circuit 15.

The current-sensing circuit is operative to monitor the current $I_{SENSE}$ flowing through scaling resistor 37. This current is the product of the output current $I_{OUT}$ flowing from the common node 35 to the inductor 50 times the ratio of the ON-resistance $R_{DS40ON}$ of the lower NFET 40 to the resistance $R_{37}$ of the scaling resistor 37, and is thus proportionally representative of the output current $I_{OUT}$. The load current $I_L$, namely the current $I_{50}$ flowing through the inductor 50, is substantially equal to the output current $I_{OUT}$ minus the current $I_{SENSE}$ flowing through the scaling resistor 37.

As the ratio of $R_{DS40ON}$ to $R_{37}$ is typically relatively small, the current $I_{SENSE}$ will be substantially smaller than the output current $I_{OUT}$, so that the output current $I_{OUT}$ and the load current $I_L$ will have substantially similar magnitudes, making $I_{SENSE}$ representative of load current. The resistance of the scaling resistor 37 is selected to provide a prescribed value of current flow for the values of load current $I_L$ and/or the value of the ON-state resistance $R_{DS40ON}$ of the lower NFET 40. Thus, the sensitivity or magnitude of, for example, voltage droop, current limiting or trip, and current balancing incorporated into the DC/DC converter is effectively 'scaled' by selecting resistor 37 relative to the value of the on-state resistance $R_{DS40ON}$ of the lower NFET 40. Moreover, the voltage drop across the on-state resistance $R_{DS40ON}$ of the lower NFET 40 (usually negative) is accommodated in the converter without a negative voltage supply. In addition, since the ON-resistance $R_{DS40ON}$ of the lower NFET 40 varies with temperature, scaling resistor 37 must be selected to have a temperature coefficient which offsets the behavior of NFET 40. This may be accomplished by replacing scaling resistor 37 with a network of resistors and positive temperature coefficient thermistors.

As shown in greater detail in FIG. 2, the controller's current-sensing circuit 15 comprises a sense amplifier 200 having a first, non-inverting (+) input 201 coupled to a controller SENSE-port 11, and a second, inverting (−) input 202 coupled to a controller SENSE+ port 12. The SENSE-port 11 is coupled to the grounded termination of NFET 40, while the SENSE+ port 12 is coupled through scaling resistor 37 to common node 35. The sense amplifier 200 has its output 203 coupled to the gate 213 of an NFET 210, whose drain-source path is coupled between the SENSE+ port 12 and input terminal 221 of a sample-and-hold circuit 220. Sample-and-hold circuit 220 includes PFETs 240 and 250 coupled with a capacitor 260 and input sampling switching circuitry.

In operation, the sense amplifier 200 and NFET 210 (which serves as a controlled impedance) are operative to continuously drive the controller's SENSE+ port 11 toward ground potential. This forces the end of the current feedback resistor 37 which is connected to controller SENSE+ port 11 to be at ground potential and the end connected to common node 35 to have a negative voltage. The negative voltage at common output node 35 will be equal to the product of the output current $I_{OUT}$ and the on-state resistance $R_{DS40ON}$ between the drain and source of the lower NFET 40.

Current from the sample and hold circuit 220 flows into the drain and out of the source of NFET 210 into the SENSE+ port 11. Also flowing into the SENSE+ port 11 from the opposite direction is the current $I_{SENSE}$ which, as described above, is representative of load current $I_L$. In order to maintain the SENSE+ port 11 at ground potential, sense amplifier 200 adjusts the current flowing through NFET 210 and into SENSE+ port 11 to be substantially equal to $I_{SENSE}$. Since $I_{SENSE}$ is representative of the load current $I_L$, the current flowing through NFET 210 and into SENSE+ port 11, as controlled by sense amplifier 200, is also representative of load current $I_L$.

Within the controller 10, sampling control circuitry periodically supplies a sampling control signal to the sample-and-hold circuit 220, when NFET 210 is in its ON (conducting) state. In response to this sampling control signal, the sample-and-hold circuit 220 samples the current flowing through NFET 210 and stores the sampled value on capacitor 260 via node 236. Thus, the sampled current value acquired by the sample-and-hold circuit 220 is also representative of load current $I_L$. This sampled value of sensed current is coupled from the sample and hold circuit's output port 223 to the controller's error amplifier circuitry that monitors the output node 55.

As pointed out above, the scaling resistor 37 that couples the common node 35 to the controller's SENSE+ port 11 must have a temperature coefficient that offsets the behavior of the on-state resistance $R_{DS40ON}$ of the lower NFET 40 (which varies with temperature and may be as high as forty percent over a typical operating range). As a result, it is customary to employ some form of complicated and costly feedback network in place of resistor 37.

SUMMARY OF THE INVENTION

In accordance with the present invention, the above-discussed temperature variation problem is successfully addressed by a new and improved current-sensing and correction circuit, containing programmable temperature compensation circuitry and being configured to be incorporated into a DC—DC converter, such as the buck mode architecture of the type shown in FIGS. 1 and 2, described above.

The front end portion of each embodiment of the invention includes sense amplifier, NFET and sample-and-hold components described above with reference to FIG. 2. In addition to providing the sampled sense current to the sample-and-hold output terminal, an auxiliary output of the sample-and-hold circuit supplies a copy of the sampled sense current to a programming resistor having a programmable resistance. The voltage produced across the programming resistor is coupled to respective high temperature compensation (HIGHtc) and low temperature compensation (LOWtc) auxiliary sense amplifiers.

The output of the HIGHtc auxiliary sense amplifier controls a HIGHtc NFET, the drain-source path of which is coupled to a HIGHtc scaling resistor. The temperature coefficient of resistance of the HIGHtc scaling resistor is higher than that of a LOWtc scaling resistor in the source-drain path of a LOWtc NFET at the output of the LOWtc auxiliary sense amplifier. The source-drain path of the HIGHtc NFET is coupled to a current mirror, which supplies a copy of the current in the source-drain path of the HIGHtc NFET to summing node, that serves as the output of the current-sensing and correction circuit. The summing node combines the HIGHtc and LOWtc currents and the sensed current to produce a "temperature-corrected" output current that is coupled to the controller's error amplifier circuitry in place of the sensed current.

Since the temperature coefficient of the HIGHtc scaling resistor is larger than the temperature coefficient of the LOWtc scaling resistor, the ratio of the resistance of the HIGHtc resistor to that of the programming resistor will have a larger slope with temperature than the ratio of the resistance of the LOWtc resistor to that of the programmiong resistor. As a result, the contribution of the HIGHtc current flowing into the output node will decrease with increasing temperature faster than the contribution of the LOWtc current flowing out of the output node, so that the composite corrected current will decrease with increase in temperature.

For temperatures greater than a HIGHtc/LOWtc current-equality temperature, at which point the HIGHtc and LOWtc resistors are equal, the ratio of the corrected current to the sensed current will be less than 1.0; for temperatures below this current-equality temperature, the ratio of the corrected current to the sensed current will be greater than 1.0. Namely, the temperature-compensating relationship of the corrected current to the sensed current is such that the ratio of corrected current to sensed current follows a deterministic curve at temperatures other than said predetermined temperature. It should be noted that the amount of temperature compensation is set by the programming resistor.

In a second embodiment, the first embodiment is modified to substitute an additional gain stage for the current mirror that supplies the replicated HIGHtc current to the output/summing node. This provides more temperature dependence for given values of thermal coefficients of resistance.

DETAILED DESCRIPTION

Before describing a number of embodiments of the current-sensing circuit of the invention, which provides programmable, continuous compensation for variations in the operational temperature of an output switching MOSFET of a buck mode DC—DC converter, it should be observed that the invention resides primarily in an arrangement of conventional DC power supply circuit and control components, and the manner in which they are integrated together to realize a temperature-compensated power supply architecture of the type described briefly above.

It will also be appreciated that the invention may be embodied in a variety of other implementations, and should not be construed as being limited to only those shown and described herein. For example, although the non-limiting circuit implementations of the Figures shows the use of MOSFET devices, it is to be understood that the invention is not limited thereto, but also may be configured of alternative equivalent circuit devices, such as bipolar transistors, for example. The implementation examples to be described are intended to furnish only those specifics that are pertinent to the present invention, so as not to obscure the disclosure with details that are readily apparent to one skilled in the art having the benefit of present description. Throughout the text and drawings like numbers refer to like parts.

Figure 1:
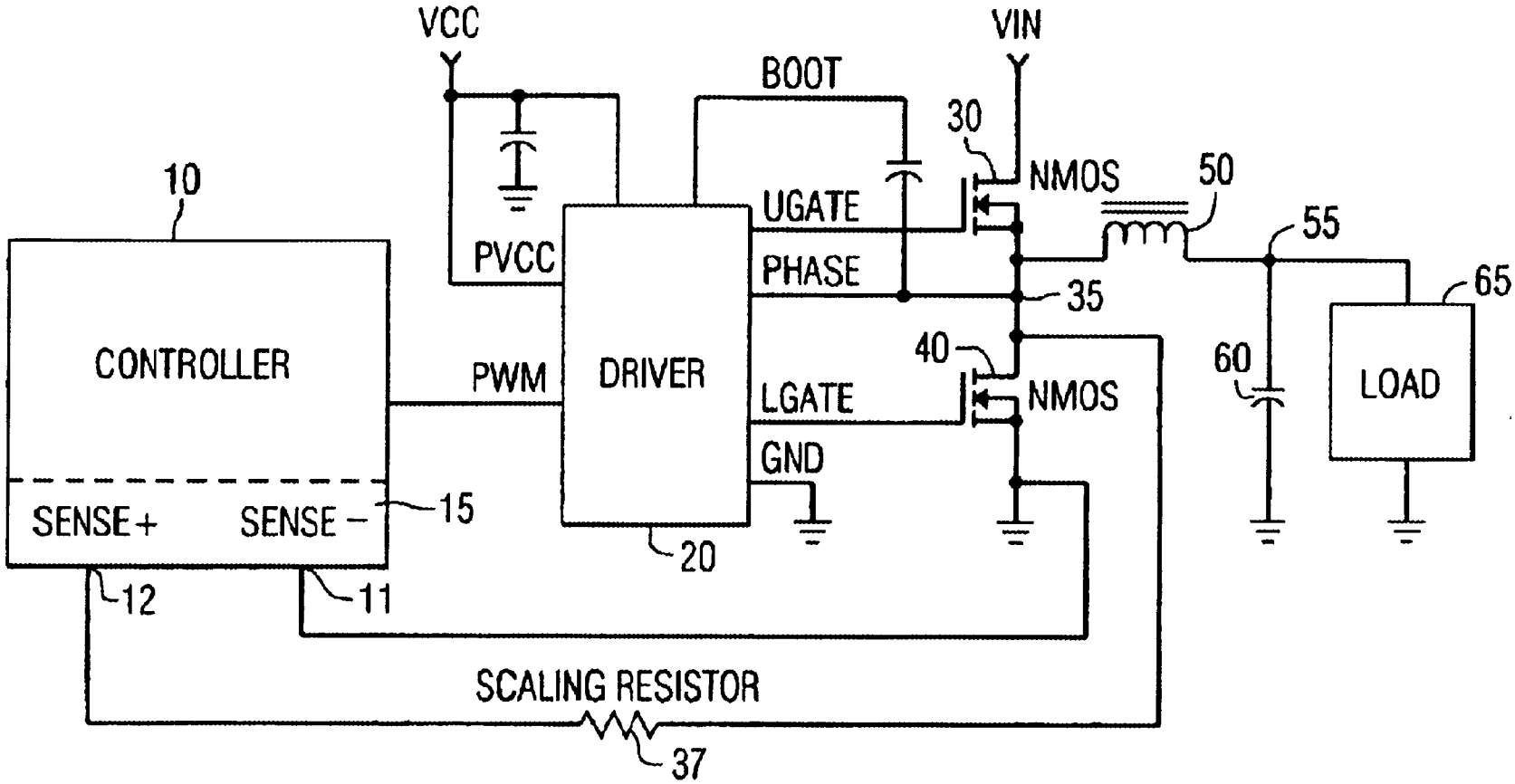
FIG. 1 PRIOR ART
FIG. 1 diagrammatically illustrates a conventional buck-mode, pulse width modulation (PWM) based, DC—DC converter.
Figure 2:
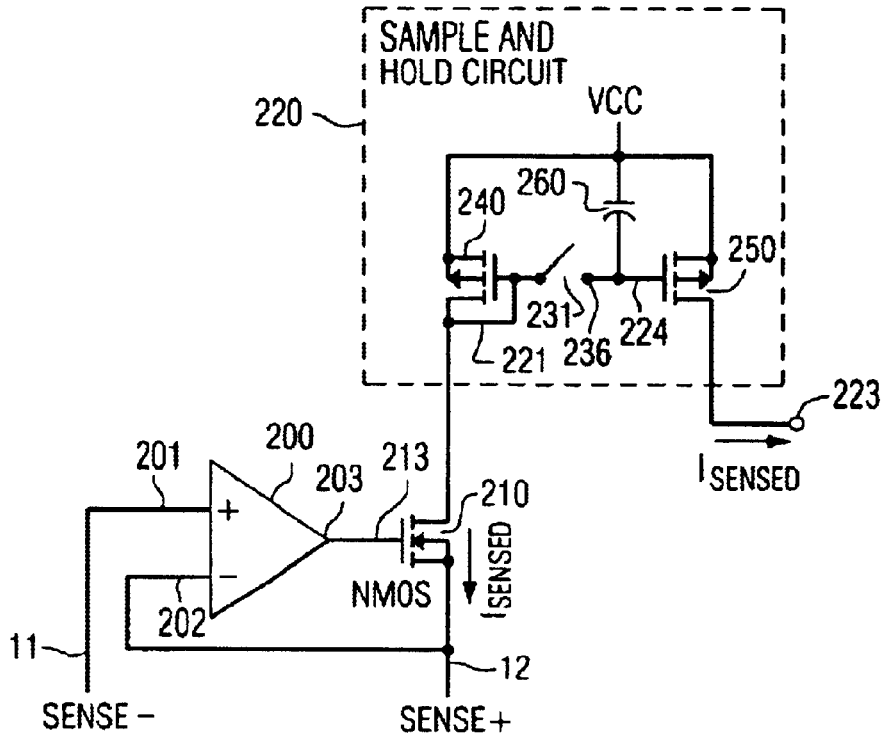
FIG. 2 PRIOR ART
FIG. 2 diagrammatically illustrates a current-sensing circuit for the controller of the DC—DC converter of FIG. 1.
Figure 3:
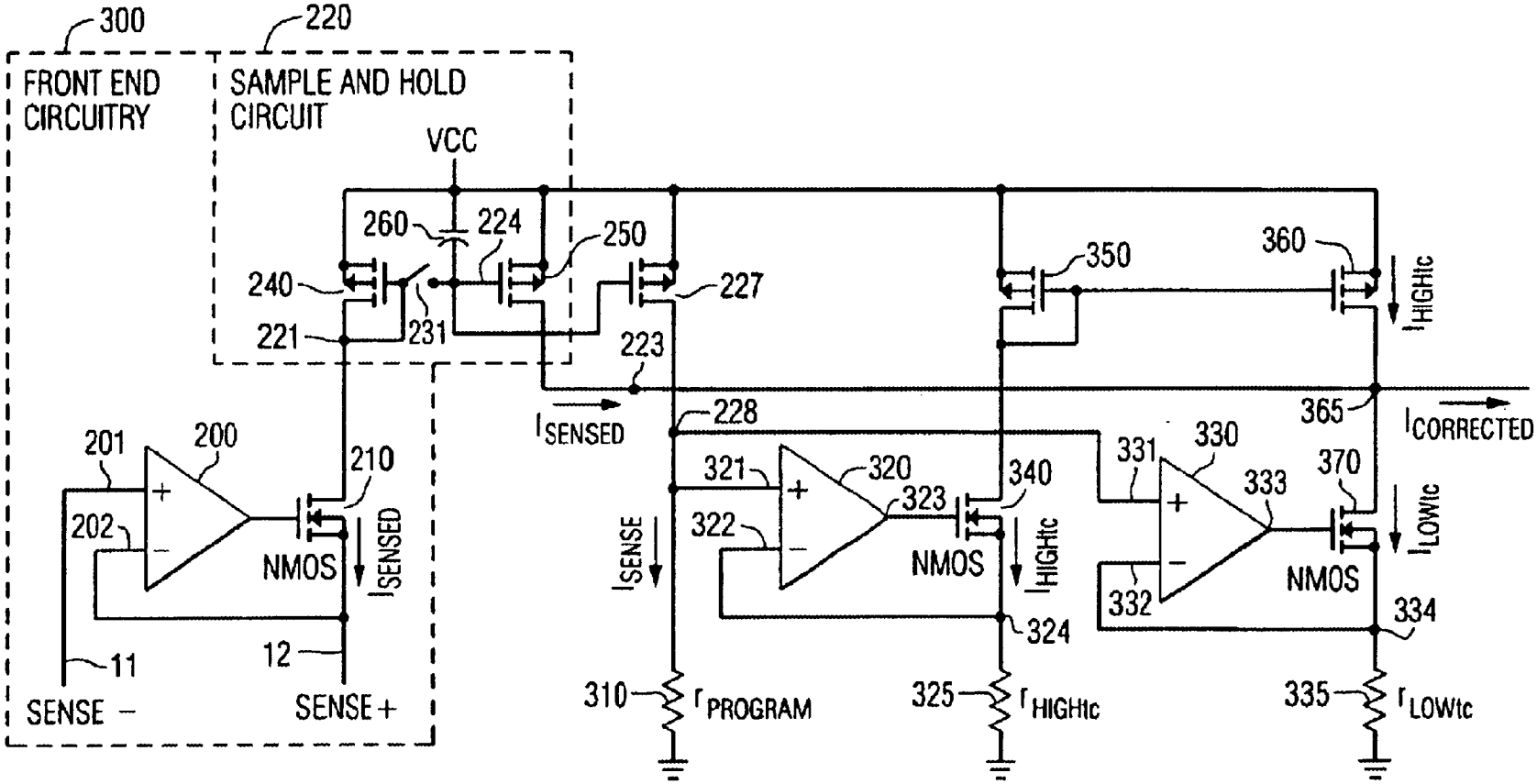
FIG. 3 diagrammatically shows a current-sensing and programmable temperature-compensation circuit in accordance with a first embodiment of the present invention.

Attention is now directed to FIG. 3, which diagrammatically illustrates a first embodiment of a current-sensing and correction circuit in accordance with the present invention, containing programmable temperature compensation circuitry and being configured to be incorporated into a buck mode DC—DC converter of the type shown in FIGS. 1 and 2, described above. The front end portion of the temperature compensated current sensing and correction circuit of FIG. 3, shown within broken lines 300, contains the sense amplifier, NFET and sample-and-hold components shown in FIG. 2, discussed above. As such, these components will not be redescribed, except as necessary to explain the architecture and operation of the invention.

Within the front end circuitry 300 of the temperature compensated sense amplifier, a sample value storage node 224 of the sample-and-hold circuit 220 is connected to a sampled value storage capacitor 260, which is switchably coupled (via switching unit 231) to input node 221, so that it may receive and store a sampled value of the sensed current. Node 224 is further coupled to the gate of an output PMOSFET 250 that supplies the sampled sense current $I_{SENSE}$ to the sample-and-hold output terminal 223, and additionally to the gate of an auxiliary output PMOSFET 227, that supplies a copy of the sample sense $I_{SENSE}$ current to an auxiliary output terminal 228.

This copy of the $I_{SENSE}$ current provided by the auxiliary output terminal 228 is coupled to a programming resistor 310, referenced to ground and having a programmable resistance $r_{PROGRAM}$. (Ideally, the temperature coefficient of the programming resistor 310 is zero or very close to zero). The programming resistor is used to change the slope of a deterministic curve, such as that shown in FIG. 4, which represents the ratio of corrected or temperature-compensated current to the sensed current $I_{SENSE}$.

The voltage produced across the programming resistor 310 at node 228 is coupled to each of a first, non-inverting (+) input 321 of a first auxiliary sense amplifier 320, and to a first, non-inverting (+) input 331 of a second auxiliary sense amplifier 330. The first auxiliary sense amplifier 320 has its second, inverting (−) input 322 coupled to a node 324 between a first, 'HIGHtc' scaling resistor 325 and the source-drain current flow path of an NFET 340.

NFET 340 has its gate coupled to the output 323 of the first auxiliary sense amplifier 320. Scaling resistor 325, which is coupled to ground, has a first prescribed scaling resistance value $r_{HIGHtc}$, that serves to reduce the ratio of a composite, temperature compensated, or corrected, output current $I_{CORRECTED}$ to the $I_{SENSE}$ current at temperatures above a predetermined temperature. In the present example, the temperature coefficient of resistance of the scaling resistance 325 is higher than the temperature coefficient of resistance of a second scaling resistor 335, to be described.

The source-drain path of NFET 340 is coupled to the source-drain path of a current mirror PFET 350, which is referenced to the VCC voltage rail. NFET 340 is controlled by the first auxiliary sense amplifier 320 to produce a first fractional, or scaled, version of sense current $I_{SENSE}$ as a first temperature compensation current $I_{HIGHtc}$, that is combined with the sense current $I_{SENSE}$ and a second temperature compensation current $I_{LOWtc}$, to realize the temperature corrected, output current $I_{CORRECTED}$, as will be described.

PFET 350 is coupled in current-mirror configuration with PFET 360, which has its source-drain path referenced to the VCC voltage rail, and coupled via an output node 365 to the source-drain path an NFET 370. As result, the source-drain path of current mirror PFET 360 mirrors the 'high' temperature coefficient compensation current $I_{HIGHtc}$ (flowing through the scaling resistor 325 and the source-drain path of PFET 350) and couples this current to the output node 365.

Output node 365, from which the 'corrected' sense current $I_{CORRECTED}$ is derived, is coupled in common with the output port 223 of the sample and hold circuit 220. NFET 370 has its source-drain path coupled to a node 334 between a second, 'LOWtc' scaling resistor 335 and the source-drain current flow path of an NFET 370. Scaling resistor 335 is coupled to ground. Node 334 is coupled to an inverting (−) input 332 of the second auxiliary amplifier 330. As pointed out above, in the present example, the temperature coefficient of resistance of the scaling resistance 335 is lower than the temperature coefficient of resistance of a scaling resistor 325.

Similar to NFET 340, NFET 370 is controlled by the output of the second auxiliary sense amplifier 330 to produce a second scaled version of the sense current $I_{SENSE}$ as a second temperature compensation current $I_{LOWtc}$. This second temperature compensation current is combined at output port 365 with the sense current $I_{SENSE}$ and the first temperature compensation current $I_{HIGHtc}$, to realize the temperature corrected, output current $I_{CORRECTED}$.

In operation, the copy of the current $I_{SENSE}$ provided by auxiliary output 228 flows through programming resistor 310 to produce a voltage $Vr_{PROGRAM}$ across the programming resistor. This voltage is applied to the non-inverting (+) inputs of each of the auxiliary sense amplifiers 320 and 330. In response to this voltage, the first auxiliary amplifier 320 drives the gate of NFET 340, to produce a source-drain current $I_{HIGHtc}$, that flows through scaling resistor 325; in a like manner, the second auxiliary amplifier 330 drives the gate of NFET 370, to produce a source-drain current $I_{LOWtc}$, that flows through scaling resistor 335.

The value of the drain-source current $I_{HIGHtc}$ through NFET 340 is proportional to the current $I_{SENSE}$ in accordance with the ratio of the resistance ($r_{PROGRAM}$) of the programming resistor 310 (through which the current $I_{SENSE}$ flows) and the resistance $r_{HIGHtc}$ of the scaling resistor 325 (through which the current $I_{HIGHtc}$ flows). Namely, $I_{HIGHtc} = I_{SENSE} * (r_{PROGARM}/r_{HIGHtc})$. Similarly, the value of the drain-source current $I_{LOWtc}$ through the NFET 370 is proportional to the current $I_{SENSE}$ in accordance with the ratio of the resistance ($r_{PROGRAM}$) of the programming resistor 310 and the resistance $r_{LOWtc}$ of the scaling resistor 335 (through which the current $I_{LOWtc}$ flows). Namely, $I_{LOWtc}=I_{SENSE}*(r_{PROGRAM}/r_{LOWtc})$.

The two currents $I_{HIGHtc}$ and $I_{LOWtc}$ are set at the same value for a particular operating temperature (such as 25° C.). Since current mirror PFET 360 is operative to mirror the temperature compensation current $I_{HIGHtc}$ in the source-drain path of PFET 350 in accordance with the operation of NFET 340, the output node 365 is supplied with three current components: 1—the sense current $I_{SENSE}$ from port 223 of the sample and hold circuit 220; 2—the current $I_{HIGHtc}$ mirrored by PFET 360; and 3—the current $I_{LOWtc}$ produced by NFET 370. Due to the directions of current flow of these three current components relative to output node 365, a composite temperature-compensated output current $I_{CORRECTED}$ can be defined as:

$$I_{CORRECTED}=I_{SENSE}-I_{LOWtc}+I_{HIGHtc}, \text{ or}$$

$$I_{CORRECTED}=I_{SENSE}*(1-(r_{PROGRAM}/r_{LOWtc})+(r_{PROGRAM}/r_{HIGHtc})).$$

This temperature-compensated current $I_{CORRECTED}$ is coupled to the controller's error amplifier circuitry in place of the sensed current $I_{SENSE}$, as described above.

Figure 4:
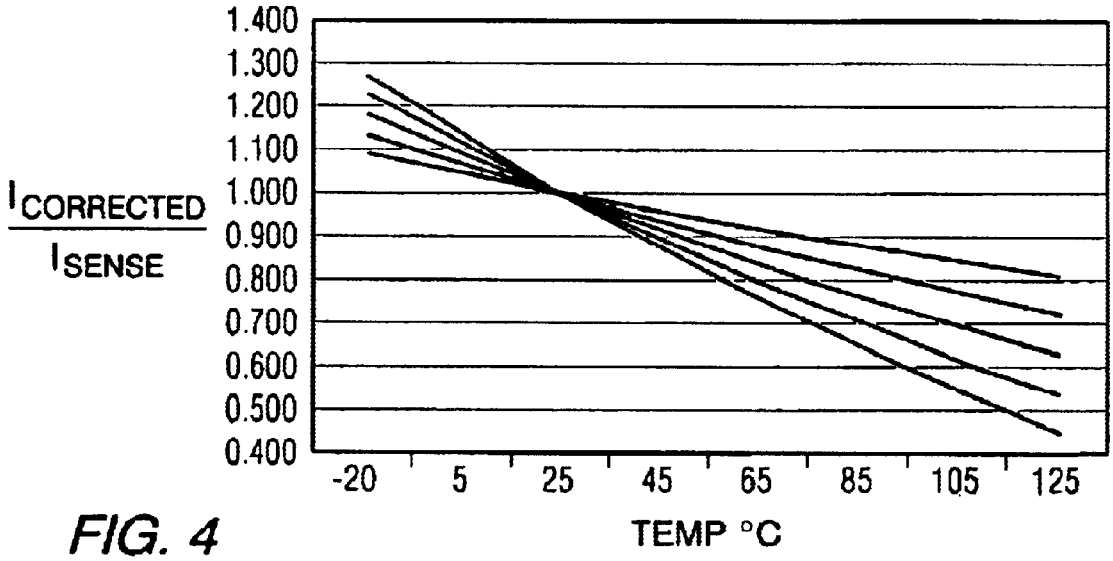
FIG. 4 graphically depicts the relationship between the ratio of temperature-compensated current $I_{CORRECTED}$ to sense current $I_{SENSE}$ over a temperature range (−20° C. to +125° C.), for a number of different resistance values $R_{PROGRAM}$ of the programming resistor of the embodiment of the current-sensing and programmable temperature-compensation circuit of FIG. 3.

FIG. 4 contains a family of deterministic curves, that graphically depict the temperature-compensating relationship (i.e., ratio) of the temperature-compensated or correction current $I_{CORRECTED}$ to the sense current $I_{SENSE}$ over a typical operational temperature range (−20° C. to +125° C.), for a number of different resistance values $R_{PROGRAM}$ of the programming resistor 310, and with the two currents $I_{HIGHtc}$ and $I_{LOWtc}$ being the same at the above-referenced value of 25° C. As shown therein, for the temperature (25° C.) at which the two currents $I_{HIGHtc}$ and $I_{LOWtc}$ are equal, from the above equation for $I_{CORRECTED}$, the ratio of $I_{CORRECTED}$ to $I_{SENSE}$, i.e., $I_{CORRECTED}/I_{SENSE}=1.0$.

Since the temperature coefficient of resistance of resistor 325 is greater than the temperature coefficient of resistance of resistor 335, the ratio of the resistance of resistor 325 to the resistance of programming resistor 310 will increase with temperature faster than the ratio of the resistance of resistor 335 to the resistance of programming resistor 310. As a result, as the temperature increases, the contribution of the current component $I_{HIGHtc}$ into node 365 will decrease faster than the contribution of the current $I_{LOWtc}$ away from node 365, so that the composite current $I_{CORRECTED}$ will decrease.

Thus, for temperatures greater than the current-equality ($I_{HIGHtc}=I_{LOWtc}$) temperature, $I_{CORRECTED}/I_{SENSE}$ will be less than 1.0, while for temperatures below the current-equality ($I_{HIGHtc}=I_{LOWtc}$) temperature, $I_{CORRECTED}/I_{SENSE}$ will be greater than 1.0, as shown.

Figure 5:
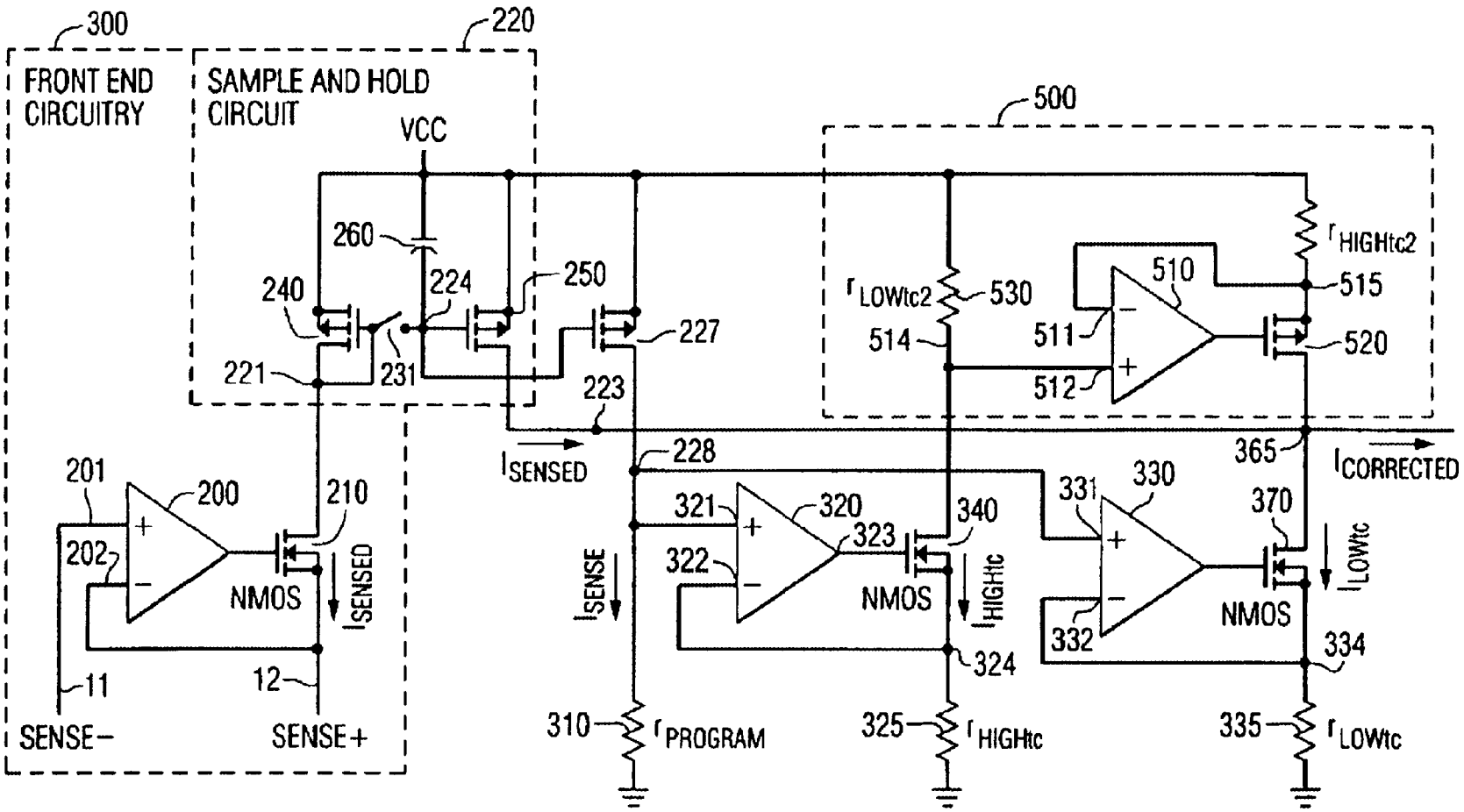
FIG. 5 diagrammatically shows a current-sensing and programmable temperature-compensation circuit in accordance with a second embodiment of the invention, in which the embodiment of FIG. 3 is modified to incorporate an additional gain stage in place of the current mirror circuitry that is used to supply the replicated current component $I_{HIGHtc}$ to the output node.

FIG. 5 diagrammatically shows a second embodiment of the current sensing circuit of the invention, in which the first embodiment of FIG. 3 is modified to incorporate an additional gain stage in place of the current mirror circuitry that is used to supply the replicated current component $I_{HIGHtc}$ to the output node. In particular, PFETs 350 and 360 of the first embodiment are replaced with a gain stage 500 having a third auxiliary amplifier 510 which drives a PFET 520. Amplifier 510 has its non-inverting (+) input 512 coupled to a node 514, which is connected in common to a scaling resistor 530 referenced to VCC and NFET 340. Scaling resistor 530 has a resistance $r_{LOWtc2}$. Amplifier 510 has its inverting (−) input 511 coupled to a node 515, which is connected in common to a scaling resistor 540 referenced to VCC and PFET 520. Scaling resistor 540 has a resistance $r_{HIGHtc2}$.

This modified architecture operates in the same manner as current mirror PMOSFETs 350 and 360, but modifies the current output of PMOSFET 520 dependent on temperature.

Resistance $r_{HIGHtc2}$ has a higher thermal coefficient of resistance than resistance $r_{LOWtc2}$. At some reference temperature, such as the temperature at which resistance $r_{HIGHtc}$ and resistance $r_{LOWtc}$ are equal, as described above, resistance $r_{HIGHtc2}$ and resistance $r_{LOWtc2}$ are equal. At this temperature, the current through the resistance $r_{HIGHtc}$ 325, and NMOSFET 340 into resistance $r_{LOWtc2}$ 530 is replicated by PMOSFET 520 through resistance $r_{HIGHtc2}$ 540. As the temperature increases above this point, the ratio of $r_{HIGHtc2}/r_{LOWtc2}$ increases and, conversely, the current out of PMOSFET 520 decreases. The current out of PMOSFET 520, or $I_{HIGHtc}$, becomes equal to: $I_{SENSE}*(R_{PROGRAM}/R_{HIGHtc})*(R_{LOWtc2}/R_{HIGHtc2})$.

As described above, the current out of NMOSFET 370, or $I_{LOWtc}$, is $I_{SENSE}*(R_{PROGRAM}/R_{LOWTC})$.

The corrected current is $I_{SENSE}+I_{HIGHtc}-I_{LOWtc}$, or $$I_{SENSE}(1+R_{PROGRAM}(R_{LOWtc2}/(R_{HIGHtc+}R_{HIGHtc2+})-(1/R_{LOWtc})).$$

This gives a higher rate of change with temperature compared to the first embodiment, which is:

$$I_{SENSE}(1+R_{PROGRAM}((1/R_{HIGHtc})-(1/R_{LOWtc}))).$$

It may be noted that additional gain stages such as gain stage 500 may be added for additional increases in thermal gain.

This temperature-compensated current $I_{CORRECTED}$ is coupled to the controller's error amplifier circuitry in place of the sensed current $I_{SENSE}$, as described above.

As will be appreciated from the foregoing description, the inability of a simple scaling resistor installed between the common node of a DC—DC converter to a controller sense port to provide compensation for the temperature-responsive behavior of the on-state resistance of the lower NFET in the converter, (which may be as high as forty percent over a typical operating range), is successfully addressed by the current-sensing circuit of the invention, which provides programmable, continuous compensation for temperature variations of an output switching MOSFET of a buck mode DC—DC converter.

By coupling copies of the sampled current, that has been sensed through a sense resistor coupled to the common MOSFET node of the DC—DC converter, to prescribed programming and scaling resistors coupled to high and low auxiliary sense amplifiers, which drive 'high' temperature coefficient (hightc') and 'low' temperature coefficient ('lowtc') associated, controlled 'hightc' and 'lowtc' current paths, a corrected current can be derived as a combination of the sensed current and the controlled 'hightc' and 'lowtc' currents. Due to the directions of current flow of these three current components relative to output the node, a composite temperature-compensated output current $I_{CORRECTED}$ can be defined in as:

$$I_{CORRECTED}=I_{SENSE}-I_{LOWtc}+I_{HIGHtc} \text{ or, in terms of the resistors, as:}$$

$$I_{CORRECTED}=I_{SENSE}*(1-(r_{PROGRAM}/r_{LOWtc})+(r_{PROGRAM}/r_{HIGHtc})).$$

Thus the ratio of $I_{CORRECTED}$ to $I_{SENSE}$ can be written as:

$$I_{CORRECTED}/I_{SENSE}=1-(r_{PROGRAM}/r_{LOWtc})+(r_{PROGRAM}/r_{HIGHtc}).$$

In a second embodiment an additional gain stage is inserted in place of the current mirror circuitry that is used to supply the replicated current component $I_{HIGHtc}$ to the output node, so that the output current of the PMOSFET is modified in dependence on temperature. The corrected current is $I_{SENSE}+I_{HIGHtc}-I_{LOWtc}$, or $$I_{SENSE}(1+R_{PROGRAM}(R_{LOWtc2}/(R_{HIGHtc4}R_{HIGHtc2+})-(1/R_{LOWtc})).$$

As noted above, this gives a higher rate of change with temperature compared to the first embodiment, as:

$$I_{SENSE}(1+R_{PROGRAM}((1/R_{HIGHtc})-(1/R_{LOWtc}))).$$

The temperature-compensated current $I_{CORRECTED}$ is coupled to the controller's error amplifier circuitry to track the temperature variations in the drain-source resistance of the lower MOSFET of the converter.

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

[1. An apparatus for generating a regulated direct current (DC) output voltage comprising:

a DC—DC converter coupled to a supply voltage, and being operative to generate a regulated output voltage derived from said supply voltage, said DC—DC converter having a pulse width modulation generator which generates a PWM switching signal that switchably controls operation of a switching circuit containing first and second electronic power switching devices coupled between respective first and second power supply terminals, a common node thereof being coupled through an inductor element to an output voltage terminal; and a controller for controlling the operation of said PWM generator, said controller including a sense amplifier unit having an input coupled to said first power supply terminal, a second input and an output, a current feedback resistor electrically coupled between said common output node and said second input of said sense amplifier unit, a variable impedance coupled to said output of said sense amplifier unit and to said second input of said sense amplifier unit, said variable impedance configured to vary in impedance in response to said output of said sense amplifier unit, a sample and hold circuit coupled to said variable impedance, and being operative to sample and hold current flowing through said variable impedance as a sensed current, and a sensed current correction circuit, coupled between said sample and hold circuit and said controller, and being operative to supply, to said controller, a correction current having a prescribed temperature-compensating relationship to said sensed current as sampled and held by said sample and hold circuit.]

[2. The apparatus according to claim 1, wherein said prescribed temperature-compensating relationship of said correction current to said sensed current is such that the ratio of said correction current to said sensed current equals one at a predetermined temperature, and has a values other than one at temperatures other than said predetermined temperature.]

[3. The apparatus according to claim 1, wherein said prescribed temperature-compensating relationship of said correction current to said sensed current is such that the ratio of said correction current to said sensed current follows a deterministic curve at temperatures other than said predetermined temperature.]

[4. The apparatus according to claim 3, wherein said first electronic power switching device comprises a MOSFET, and said deterministic curve approximates a variation of drain-source resistance of said MOSFET with temperature.]

[5. The apparatus according to claim 3, wherein said sensed current correction circuit includes a programming element that is operative to change the slope of said deterministic curve.]

[6. The apparatus according to claim 1, wherein said prescribed temperature-compensating relationship of said correction current to said sensed current is such that said correction current equals said sensed current at a predetermined temperature and, at temperatures above said predetermined temperature the ratio of said correction current to said sensed current is less than one, and at temperatures below said predetermined temperature the ratio of said correction current to said sensed current is greater than one.]

[7. The apparatus according to claim 1, wherein said sensed current correction circuit includes a programming element that is effective to establish said prescribed temperature-compensating relationship to said current as sampled and held by said sample and hold circuit.]

[8. The apparatus according to claim 1, wherein said sample and hold circuit is operative to generate first and second sensed currents, each of which is representative of said current as sampled and held by said sample and hold circuit, and said sensed current correction circuit includes a first sensed current path, that is operative to process said first sensed current to produce first and second scaled versions of said sensed current, and a second sensed current path, coupled with said first sensed current path, and being operative to combine said second sensed current with said first and second scaled versions of said sensed current to produce said control current.]

[9. The apparatus according to claim 8, wherein said first sensed current path is operative to process said first sensed current in accordance with a programmable circuit element to produce first and second scaled versions of said sensed current.]

[10. The apparatus according to claim 9, wherein said first current path includes said programmable circuit element, and first and second auxiliary amplifier circuits coupled to said programmable circuit element to produce said first and second scaled versions of said sensed current.]

[11. The apparatus according to claim 10, wherein said first current path includes a current flow direction circuit coupled with one of said first and second auxiliary amplifier circuits and being operative to supply one of said first and second scaled versions of said sensed current with a prescribed current flow direction relative to said second sensed current.]

[12. The apparatus according to claim 11, wherein said current flow direction circuit comprises a current mirror circuit coupled to said first auxiliary amplifier circuit and being operative to supply said first scaled version of said sensed current with said prescribed current flow direction relative to said second sensed current.]

[13. The apparatus according to claim 11, wherein said current flow direction circuit comprises a third auxiliary amplifier circuit coupled to said first auxiliary amplifier circuit and being operative to supply said first scaled version of said sensed current with said prescribed current flow direction relative to said second sensed current.]

[14. A power supply comprising:

a buck mode pulse width modulator (PWM) DC—DC converter circuit having an input, a high side output and a low side output;

a high side switch coupled between a first voltage supply terminal and common output node, and being operative to control current flow therethrough in response to said high side output;

a low side switch coupled between said common output node and to a second voltage supply terminal, and being operative to control current flow therethrough in response to said low side output;

a sense amplifier unit having a first input, a second input and an output, said second input coupled to said second voltage supply terminal;

a current feedback resistor electrically coupled between said common output node and said first input of said sense amplifier;

a variable impedance component electrically connected to said output of said sense amplifier unit and to said first input of said sense amplifier, said variable impedance component configured to vary in impedance in response to said output of said sense amplifier unit;

a sample and hold circuit coupled to said variable impedance component, and being operative to sample and hold current flowing through said variable impedance component as a sensed current; and a sensed current correction circuit, coupled between said sample and hold circuit and said buck mode PWM DC—DC converter, and being operative to supply, to said input of said buck mode PWM DC—DC converter, a correction current having a prescribed temperature-compensating relationship to said sensed current as sampled and held by said sample and hold circuit.]

[15. The power supply according to claim 14, wherein said prescribed temperature-compensating relationship of said correction current to said sensed current is such that the ratio of said correction current to said sensed current follows a deterministic curve at temperatures other than said predetermined temperature.]

[16. The power supply according to claim 15, wherein said first electronic power switching device comprises a MOSFET, and said deterministic curve approximates a variation of drain-source resistance of said MOSFET with temperature.]

[17. The power supply according to claim 16, wherein said sensed current correction circuit includes a programming element that is operative to change the slope of said deterministic curve.]

[18. The power supply according to claim 14, wherein said prescribed temperature-compensating relationship of said correction current to said sensed current is such that said correction current equals said sensed current at a predetermined temperature and, at temperatures above said predetermined temperature the ratio of said correction current to said sensed current is less than one, and at temperatures below said predetermined temperature the ratio of said correction current to said sensed current is greater than one.]

[19. A method of controlling the operation of a DC—DC converter, said DC—DC converter being coupled to a supply voltage, and being operative to generate a regulated output voltage derived from said supply voltage, said DC—DC converter including a pulse width modulation generator, which generates a PWM switching signal that switchably controls operation of a switching circuit containing first and second electronic power switching devices coupled between respective first and second power supply terminals, a common node thereof being coupled through an inductor element to an output voltage terminal, and a controller for controlling the operation of said PWM generator, said controller including a sense amplifier unit having a first input coupled to said first power supply terminal, a second input and an output, a current feedback resistor coupled between said common output node and said second input of said sense amplifier unit, a variable impedance coupled to said output of said sense amplifier unit, said variable impedance configured to vary in impedance in response to said output of said sense amplifier unit, and a sample and hold circuit coupled to said variable impedance, and being operative to sample and hold current flowing through said variable impedance as a sensed current, said method comprising the steps of:

(a) generating a correction current having a prescribed temperature-compensating relationship to said sensed current as sampled and held by said sample and hold circuit; and (b) coupling said correction current to said controller, so that said controller controls the operation of said PWM generator in accordance with said correction current.]

[20. The method according to claim 19, wherein said prescribed temperature-compensating relationship of said correction current to said sensed current is such that the ratio of said correction current to said sensed current equals one at a predetermined temperature, and has values other than one at temperatures other than said predetermined temperature.]

[21. The method according to claim 19, wherein said prescribed temperature-compensating relationship of said correction current to said sensed current is such that the ratio of said correction current to said sensed current follows a deterministic curve at temperatures other than said predetermined temperature.]

[22. The method according to claim 21, wherein said first electronic power switching device comprises a MOSFET, and said deterministic curve approximates a variation of drain-source resistance of said MOSFET with temperature.]

[23. The method according to claim 21, wherein step (a) comprises establishing the slope of said deterministic curve using a programming element.]

[24. The method according to claim 19, wherein said prescribed temperature-compensating relationship of said correction current to said sensed current is such that said correction current equals said sensed current at a predetermined temperature and, at temperatures above said predetermined temperature the ratio of said correction current to said sensed current is less than one, and at temperatures below said predetermined temperature the ratio of said correction current to said sensed current is greater than one.]

*25. A power supply comprising:*

*a first switch coupled to a first voltage supply terminal and to a common output node;*

*a second switch coupled to the common output node and to a second voltage supply terminal;*

*a control circuit operable to provide a first switching signal to the first switch and a second switching signal to*

*the second switch; wherein the first and second switches are turned on and off in response to the first and second switching signals, respectively;*

*a current sense circuit generating a sensed current that is related to an output current of the power supply; and*

*a sensed current correction circuit, coupled to the current sense circuit and the control circuit, and being operative to provide, to the control circuit, a correction current used to adjust the first and second switching signals, the correction current having a prescribed temperature-compensating relationship to said sensed current, wherein said correction current is a combination of said sensed current, a first compensating current and a second compensating current.*

*26. The power supply according to claim 25, wherein the prescribed temperature-compensating relationship of the correction current to the sensed current is such that the ratio of the correction current to the sensed current follows a deterministic curve at temperatures other than a predetermined temperature.*

*27. The power supply according to claim 26, wherein the second switch comprises a metal-oxide-semiconductor field-effect transistor (MOSFET), and the deterministic curve approximates an inverse of a variation of drain-source resistance of the MOSFET with temperature.*

*28. The power supply according to claim 26, wherein the sensed current correction circuit includes a programming element that is operative to change the slope of the deterministic curve.*

*29. The power supply according to claim 25, wherein the prescribed temperature-compensating relationship of the correction current to the sensed current is such that the correction current equals the sensed current at a predetermined temperature and, at temperatures above the predetermined temperature the ratio of the correction current to the sensed current is less than one, and at temperatures below the predetermined temperature the ratio of the correction current to the sensed current is greater than one.*

*30. The power supply according to claim 25, wherein the current sense circuit comprises:*

*a sense amplifier unit having a first input, a second input and an output, the first input coupled to the common output node and the second input coupled to the second voltage supply terminal;*

*a variable impedance component coupled to the output of the sense amplifier unit and to the first input of the sense amplifier unit, the variable impedance component configured to vary in impedance in response to the output of the sense amplifier unit; and*

*a sensed current providing circuit coupled to the variable impedance component, and being operative to provide a sensed current in accordance with a current flowing through the variable impedance.*

*31. The power supply according to claim 30, wherein the sensed current providing circuit comprises a sample and hold circuit operative to sample and hold current flowing through the variable impedance component as a sensed current.*

*32. The power supply according to claim 30, wherein the variable impedance component comprises an n-channel metal-oxide-semiconductor field-effect transistor (NFET).*

* * * * *